United States Patent
Chen et al.

(10) Patent No.: US 11,914,292 B2
(45) Date of Patent: Feb. 27, 2024

(54) PHOTOSENSITIVE RESIN COMPOSITION, SPACER, LIGHT CONVERSION LAYER, AND LIGHT-EMITTING DEVICE

(71) Applicant: eChem Solutions Corp., Taoyuan (TW)

(72) Inventors: Ya-Qian Chen, Taoyuan (TW); Yu-Chun Chen, Taoyuan (TW)

(73) Assignee: eChem Solutions Corp., Taoyuan (TW)

( * ) Notice: Subject to any disclaimer, the term of this patent is extended or adjusted under 35 U.S.C. 154(b) by 307 days.

(21) Appl. No.: 17/308,055

(22) Filed: May 5, 2021

(65) Prior Publication Data
US 2021/0382389 A1    Dec. 9, 2021

(30) Foreign Application Priority Data
Jun. 3, 2020 (TW) ................................. 109118548

(51) Int. Cl.
*G03F 7/029* (2006.01)
*G02F 1/1335* (2006.01)
*G03F 7/031* (2006.01)

(52) U.S. Cl.
CPC ........ *G03F 7/029* (2013.01); *G02F 1/133614* (2021.01); *G03F 7/031* (2013.01)

(58) Field of Classification Search
CPC ................. G03F 7/0007; G03F 7/0042; G02F 1/133512; G02F 1/1339; G02F 1/13394; G02F 1/13398
See application file for complete search history.

(56) References Cited

U.S. PATENT DOCUMENTS

2007/0264601 A1 * 11/2007 Uematsu ................. G03F 7/031
430/496
2009/0053626 A1 * 2/2009 Takakuwa ............. G03F 7/0007
430/7
(Continued)

FOREIGN PATENT DOCUMENTS

CN        102645691 A  *  8/2012
JP     2010054912 A  *  3/2010
(Continued)

OTHER PUBLICATIONS

English translation of KR20180134233. (Year: 2018).*
(Continued)

*Primary Examiner* — Chanceity N Robinson
*Assistant Examiner* — Anna Malloy
(74) *Attorney, Agent, or Firm* — JCIPRNET

(57) ABSTRACT

The photosensitive resin composition includes an alkali-soluble resin (A), an ethylenically-unsaturated monomer (B), a photopolymerization initiator (C), a solvent (D), and a pigment (E). The alkali-soluble resin (A) includes an alkali-soluble resin (A-1), wherein the alkali-soluble resin (A-1) includes a structural unit represented by formula (I-1) and a structural unit represented by formula (I-2). The photopolymerization initiator (C) includes an acylphosphine oxide compound represented by formula (III-1).

(Continued)

(56) References Cited

U.S. PATENT DOCUMENTS

| | | | | |
|---|---|---|---|---|
| 2010/0323284 | A1* | 12/2010 | Nakashima | C09D 7/45 |
| | | | | 430/7 |
| 2012/0003436 | A1* | 1/2012 | Saie | G03F 7/0047 |
| | | | | 430/323 |
| 2013/0285182 | A1* | 10/2013 | Saie | G03F 7/004 |
| | | | | 430/7 |
| 2016/0161847 | A1* | 6/2016 | Araki | G03F 7/0035 |
| | | | | 430/7 |
| 2018/0113383 | A1* | 4/2018 | Matsumoto | G03F 7/105 |
| 2019/0155150 | A1* | 5/2019 | Nakamura | G02B 5/223 |
| 2019/0163053 | A1* | 5/2019 | Nakamura | G03F 7/027 |
| 2020/0066803 | A1* | 2/2020 | Kim | H10K 59/38 |
| 2021/0388158 | A1* | 12/2021 | Liu | C08F 2/06 |

FOREIGN PATENT DOCUMENTS

| | | | | |
|---|---|---|---|---|
| JP | 2013041153 A | * | 2/2013 | |
| JP | 6289006 | | 3/2018 | |
| KR | 2018134233 A | * | 12/2018 | G02F 1/1339 |
| TW | 201441676 | | 11/2014 | |
| TW | 201504691 | | 2/2015 | |
| TW | I489212 | | 6/2015 | |
| TW | 201539127 | | 10/2015 | |
| TW | 201606427 | | 2/2016 | |
| TW | I571705 | | 2/2017 | |
| TW | 201814402 | | 4/2018 | |
| TW | 201823868 | | 7/2018 | |
| TW | 201912763 | | 4/2019 | |
| TW | I667534 | | 8/2019 | |
| TW | I671589 | | 9/2019 | |
| WO | 2019146685 | | 8/2019 | |

OTHER PUBLICATIONS

English translation of JP2010054912. (Year: 2010).*
English translation of CN102645691. (Year: 2012).*
English translation of JP2013041153. (Year: 2013).*
"Office Action of Taiwan Counterpart Application", dated Dec. 15, 2020, p. 1-p. 11.

\* cited by examiner formula (I-1)

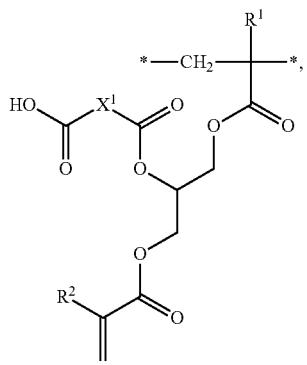

formula (I-2)

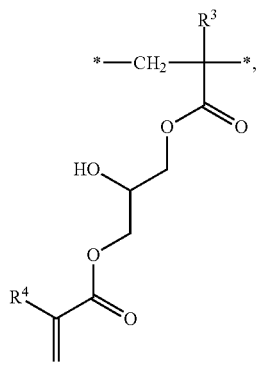

formula (III-1)

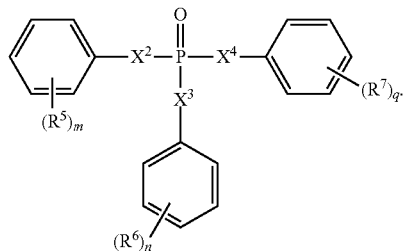

19 Claims, 2 Drawing Sheets

PHOTOSENSITIVE RESIN COMPOSITION, SPACER, LIGHT CONVERSION LAYER, AND LIGHT-EMITTING DEVICE

CROSS-REFERENCE TO RELATED APPLICATION

This application claims the priority benefit of Taiwan application serial no. 109118548, filed on Jun. 3, 2020. The entirety of the above-mentioned patent application is hereby incorporated by reference herein and made a part of this specification.

BACKGROUND OF THE INVENTION

Field of the Invention

The invention relates to a photosensitive resin composition, a spacer, a light conversion layer, and a light-emitting device, and particularly to a photosensitive resin composition for a development process, a spacer, a light conversion layer, and a light-emitting device.

Description of Related Art

At present, a color filter is mainly formed by a pigment dispersion method. The manufacturing process thereof is to first use a black matrix as a spacer, then coat a photosensitive resin composition formed by red, green, and blue colorants, and then perform processes such as coating, vacuum drying, soft baking, exposure, development, and hard baking to obtain a target pattern. However, when the pigment dispersion method is used, because the coloring agent is a pigment or a dye, light source transmission efficiency is reduced, and higher brightness, high contrast, and more diverse color performance and high color gamut may not be achieved.

In recent years, a quantum dot with quantum confinement effect has gained attention. The spontaneous emission of a light source may be used to generate light in the visible and infrared regions. A target light-emitting performance may be obtained by controlling the size and composition of the quantum dot itself. The quantum dot itself is a non-scattering particle. Therefore, when light passes through a color filter containing a quantum dot, better color performance than coloring agents generally formed by pigments or dyes may be obtained. In the manufacturing process of an optical element such as a quantum dot display and an organic electroluminescence (EL) element, pattern printing is sometimes performed by an inkjet method to facilitate the forming of a light-emitting layer and an organic layer, etc., and when pattern printing is performed by the inkjet method, in order to prevent the ink between adjacent points from mixing with each other, the surface of the spacer must have ink repellency. However, at present, the spacer is mostly based on a conventional black matrix. For a photoluminescent optical element such as a quantum dot display, light utilization rate is reduced, such that the phenomenon of poor brightness occurs.

Using a high-reflectivity resin composition as the spacer may increase the reflectivity and thus improve light utilization rate, resulting in better light-emitting efficiency. However, in order to form a spacer having a high-definition pattern and to adjust the photosensitive resin composition to form a spacer having ink repellency on the surface, the phenomena of excessive development residue at an opening portion and a pattern of the opening portion having an undercut often occur.

SUMMARY OF THE INVENTION

The inventors of the invention found that to obtain a pattern without an undercut, a more reactive photoinitiator is needed to increase the reactivity at the bottom of a photoresist, but this approach may cause photoresist residue at an edge of the pattern, thus leading to poor pattern (excessive development residue). Moreover, if good pattern characteristics are to be obtained, a less reactive photoinitiator is needed to make a non-exposed portion more readily dissolved and removed via an alkaline developing agent, but this approach may cause the pattern to have the phenomenon of an undercut.

Accordingly, the invention provides a photosensitive resin composition having good pattern characteristics (no development residue or little development residue) that may form a pattern without an undercut, a spacer formed using the photosensitive resin composition, and a light-emitting device.

The invention provides a photosensitive resin composition for a development process including an alkali-soluble resin (A), an ethylenically-unsaturated monomer (B), a photopolymerization initiator (C), a solvent (D), and a pigment (E). The alkali-soluble resin (A) includes an alkali-soluble resin (A-1), wherein the alkali-soluble resin (A-1) includes a structural unit represented by formula (I-1) and a structural unit represented by formula (I-2). The photopolymerization initiator (C) includes an acylphosphine oxide compound represented by formula (III-1).

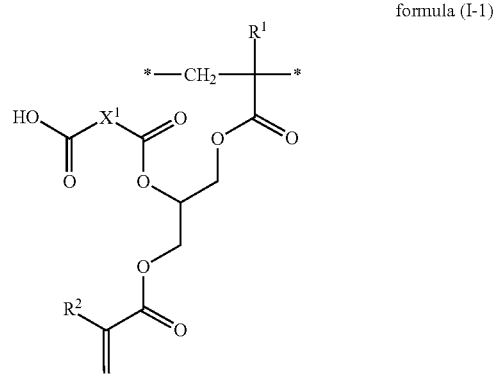

formula (I-1)

In formula (I-1), $R^1$ and $R^2$ respectively represent a hydrogen atom or a methyl group, $X^1$ represents ethylene, propylene, butylene, 1,2-phenylene, 1,2-cyclohexylene, 1,2-cyclohex-1-enylene, 4,5-cyclohex-1-enylene, or norbornenylene, and * represents a bonding position.

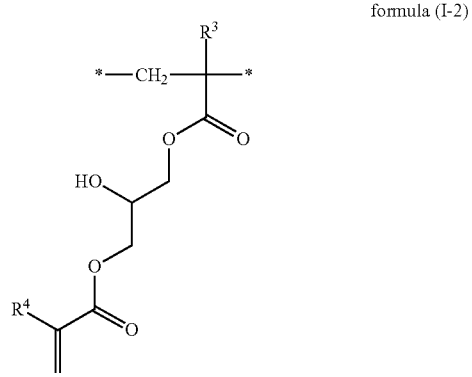

formula (I-2)

In formula (I-2), $R^3$ and $R^4$ respectively represent a hydrogen atom or a methyl group, and * represents a bonding position.

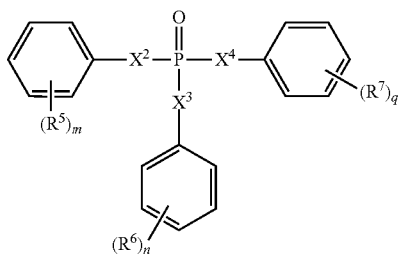

formula (III-1)

In formula (III-1), $X^2$, $X^3$, and $X^4$ respectively represent a single bond or a carbonyl group, at least one of $X^2$, $X^3$, and $X^4$ is a carbonyl group, $R^5$, $R^6$, and $R^7$ respectively represent an alkyl group, and m, n, and q respectively represent an integer of 0 to 5.

In an embodiment of the invention, in the alkali-soluble resin (A-1), based on a total of 100 mol % of the structural unit represented by formula (I-1) and the structural unit represented by formula (I-2), the structural unit represented by formula (I-1) is 30 mol % to 60 mol %.

In an embodiment of the invention, a weight-average molecular weight of the alkali-soluble resin (A-1) is 3,000 to 20,000.

In an embodiment of the invention, an acid value of the alkali-soluble resin (A-1) is 30 mgKOH/g to 100 mgKOH/g.

In an embodiment of the invention, the alkali-soluble resin (A) further includes an alkali-soluble resin (A-2), wherein the alkali-soluble resin (A-2) includes a structural unit represented by formula (I-3).

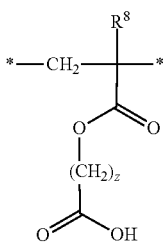

formula (I-3)

In formula (I-3), $R^8$ represents a hydrogen atom or a methyl group, z represents an integer of 1 to 10, and * represents a bonding position.

In an embodiment of the invention, a weight ratio of the alkali-soluble resin (A-1) and the alkali-soluble resin (A-2) is 1:1 to 1:3.

In an embodiment of the invention, the alkali-soluble resin (A) further includes an alkali-soluble resin (A-3), and the alkali-soluble resin (A-3) includes a structural unit represented by formula (I-4).

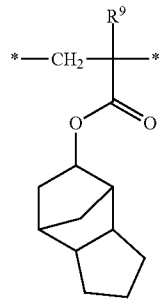

formula (I-4)

In formula (I-4), $R^9$ represents a hydrogen atom or a methyl group, and * represents a bonding position.

In an embodiment of the invention, the ethylenically-unsaturated monomer (B) includes a fluorine-containing ethylenically-unsaturated monomer (B-1) represented by formula (II-1).

formula (II-1)

In formula (II-1), $R^{10}$ represents a hydrogen atom or a methyl group, $R^{11}$ and $R^{12}$ respectively represent a hydrogen atom or a fluorine atom, at least one of $R^{11}$ and $R^{12}$ is a fluorine atom, $R^{13}$ represents a hydrogen atom, a fluorine atom, or an alkyl group, w represents an integer of 1 to 10, and y represents an integer of 1 to 10.

In an embodiment of the invention, the photopolymerization initiator (C) further includes an oxime ester-based compound.

In an embodiment of the invention, in the photopolymerization initiator (C), a weight ratio of the acylphosphine oxide compound and the oxime ester-based compound is 10:1 to 4:1.

In an embodiment of the invention, the oxime ester-based compound is a compound represented by formula (III-2).

formula (III-2)

In formula (III-2), $R^{14}$ represents an alkyl group or a cycloalkyl group, and $R^{15}$ represents an alkyl group or a phenyl group.

In an embodiment of the invention, the pigment (E) includes a white pigment (E-1), wherein the white pigment (E-1) is at least one selected from the group consisting of titanium oxide, silicon oxide, barium titanate, zirconium oxide, zinc oxide, aluminum oxide, magnesium oxide, antimony oxide, aluminum hydroxide, magnesium hydroxide, barium sulfate, calcium sulfate, magnesium carbonate, barium carbonate, calcium carbonate, strontium titanate, aluminum powder, kaolin, clay, talc, and montmorillonite.

In an embodiment of the invention, the pigment (E) further includes a black pigment (E-2), wherein the black pigment (E-2) is at least one selected from the group consisting of carbon black, chromium oxide, iron oxide, and titanium black.

In an embodiment of the invention, in the photosensitive resin composition, based on 100 parts by weight of the alkali-soluble resin (A), the ethylenically-unsaturated monomer (B) is 15 parts by weight to 35 parts by weight, the photopolymerization initiator (C) is 1 part by weight to 10 parts by weight, the solvent (D) is 20 parts by weight to 60 parts by weight, and the pigment (E) is 55 parts by weight to 95 parts by weight.

The invention provides a spacer formed by the photosensitive resin composition above.

The invention provides a light-emitting device including the spacer above.

The invention provides a light conversion layer, including: a plurality of pattern layers and a plurality of white spacers formed by the photosensitive resin composition above, wherein the plurality of white spacers are respectively interposed between the plurality of pattern layers, so that one of the plurality of pattern layers is present between every two adjacent white spacers in the plurality of white spacers.

In an embodiment of the invention, the pattern layers are red pattern layers, green pattern layers, or scatterer pattern layers.

The invention provides a light-emitting device, including: a substrate, a backlight module disposed opposite to the substrate, and a light conversion layer located between the substrate and the backlight module, wherein the light conversion layer is the light conversion layer above.

In an embodiment of the invention, the light-emitting device further includes a light filter layer located between the substrate and the light conversion layer.

Based on the above, the photosensitive resin composition of the invention includes a specific alkali-soluble resin and a specific photopolymerization initiator to provide a photosensitive resin composition having good pattern characteristics (no development reside or little development residue) that may form a pattern without an undercut, thereby alleviating the phenomena of excessive development residue and undercut of a taper angle.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

<Photosensitive Resin Composition>

Figure 1:
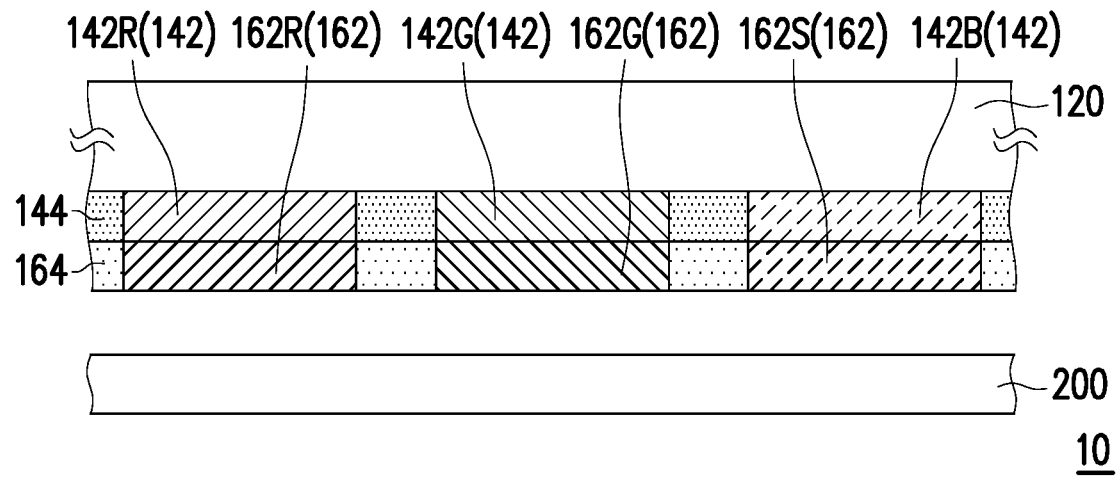
FIG. 1 is a diagram of a light-emitting device according to an embodiment of the invention.

The present embodiment provides a photosensitive resin composition including an alkali-soluble resin (A), an ethylenically-unsaturated monomer (B), a photopolymerization initiator (C), a solvent (D), and a pigment (E). Moreover, the photosensitive resin composition may further include other additives (F) if needed. In the following, the individual components used in the photosensitive resin composition of the invention are described in detail.

It should be mentioned that, in the following, (meth) acrylic acid represents acrylic acid and/or methacrylic acid, and (meth)acrylate represents acrylate and/or methacrylate.

Alkali-Soluble Resin (A)

The alkali-soluble resin (A) in the photosensitive resin composition may make the photosensitive resin composition exhibit alkali solubility to a developing agent in a subsequent development process.

The alkali-soluble resin (A) includes an alkali-soluble resin (A-1). Moreover, the alkali-soluble resin (A) may further include an alkali-soluble resin (A-2). Moreover, the alkali-soluble resin (A) may also further include an alkali-soluble resin (A-3).

Alkali-Soluble Resin (A-1)

The alkali-soluble resin (A-1) includes a structural unit represented by the following formula (I-1) and a structural unit represented by the following formula (I-2).

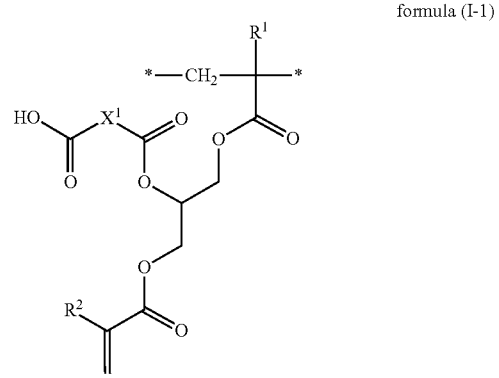

formula (I-1)

In formula (I-1), $R^1$ and $R^2$ respectively represent a hydrogen atom or a methyl group, $R^1$ preferably represents a methyl group, and $R^2$ preferably represents a hydrogen atom;

$X^1$ represents ethylene, propylene, butylene, 1,2-phenylene, 1,2-cyclohexylene, 1,2-cyclohex-1-enylene (the group represented by formula (I-1-a) below), 4,5-cyclohex-1-enylene (the group represented by formula (I-1-b) below), or norbomenylene (the group represented by formula (I-1-c) below), preferably represents 1,2-cyclohex-1-enylene or 4,5-cyclohex-1-enylene, and more preferably represents 4,5-cyclohex-1-enylene;

* represents a bonding position.

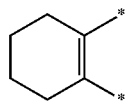

formula (I-1-a)

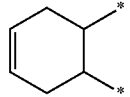

formula (I-1-b)

formula (I-1-c)

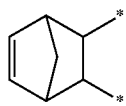

The structural unit represented by formula (I-1) is preferably a structural unit represented by the following formula (I-1-1).

formula (I-1-1)

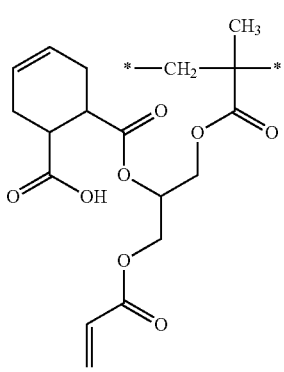

In an embodiment, in the alkali-soluble resin (A-1), based on a total of 100 mol % of the structural unit represented by formula (I-1) and the structural unit represented by formula (I-2), the structural unit represented by formula (I-1) may be 30 mol % to 60 mol %, preferably 35 mol % to 50 mol %.

formula (I-2)

In formula (I-2), $R^3$ and $R^4$ respectively represent a hydrogen atom or a methyl group, $R^3$ preferably represents a methyl group, and $R^4$ preferably represents a hydrogen atom;

* represents a bonding position.

The structural unit represented by formula (I-2) is preferably a structural unit represented by the following formula (I-2-1).

formula (I-2-1)

In an embodiment, the alkali-soluble resin (A-1) includes a structural unit represented by formula (I-1-1) and a structural unit represented by formula (I-2-1).

In am embodiment, in the alkali-soluble resin (A-1), based on a total of 100 mol % of the structural unit represented by formula (I-1) and the structural unit represented by formula (I-2), the structural unit represented by formula (I-2) may be 40 mol % to 70 mol %, preferably 50 mol % to 65 mol %.

In addition, without affecting the efficacy of the invention, the alkali-soluble resin (A-1) may further include at least one selected from the group consisting of an acrylic-based structural unit, a styrene-based structural unit, and a maleimide-based structural unit.

In the invention, the acrylic-based structural unit may be derived from an acrylic-based monomer. The acrylic-based monomer may include acrylate such as acrylic acid, methacrylic acid, methyl acrylate, ethyl acrylate, propyl acrylate, butyl acrylate, octyl acrylate, cyclohexyl acrylate, stearyl acrylate, benzyl acrylate, furfuryl acrylate, hydroxyethyl acrylate, hydroxybutyl acrylate, dimethylaminomethyl acrylate, or dimethylaminoethyl acrylate, methacrylate such as methyl methacrylate, ethyl methacrylate, propyl methacrylate, butyl methacrylate, octyl methacrylate, cyclohexyl methacrylate, stearyl methacrylate, benzyl methacrylate, furfuryl methacrylate, hydroxyethyl methacrylate, hydroxybutyl methacrylate, dimethylaminomethyl methacrylate, or dimethylaminoethyl methacrylate, amide such as acrylamide, methacrylamide, N-substituted acrylamide, or N-substituted methacrylamide, acrylonitrile, methacrylonitrile, or a combination of the above compounds.

In the invention, the styrene-based structural unit may be derived from a styrene-based monomer. The styrene-based structural monomer may include styrene, p-methylstyrene, m-methylstyrene, o-methylstyrene, p-methoxystyrene, p-phenylstyrene, p-chlorostyrene, 3,4-dichlorostyrene, p-ethylstyrene, 2,4-dimethylstyrene, p-n-butyl styrene, p-tert-butyl styrene, p-n-hexylstyrene, p-n-octyl styrene, p-n-nonylstyrene, p-n-decyl styrene, p-n-dodecyl styrene, or a combination of the above compounds.

In the invention, the maleimide-based structural unit may be derived from a maleimide-based monomer. The maleimide-based monomer may include maleimide, N-methylmaleimide, N-ethylmaleimide, N-propylmaleimide, N-isopropylmaleimide, N-cyclohexylmaleimide, N-phenylmaleimide, or a combination of the above compounds.

In an embodiment, the weight-average molecular weight of the alkali-soluble resin (A-1) may be 3,000 to 20,000, preferably 4,000 to 12,000.

In an embodiment, the acid value of the alkali-soluble resin (A-1) may be 30 mgKOH/g to 100 mgKOH/g, preferably 35 mgKOH/g to 80 mgKOH/g.

When the alkali-soluble resin (A) includes the alkali-soluble resin (A-1), the photosensitive resin composition may have good pattern characteristics, and the photosensitive resin composition may form a pattern without an undercut. Moreover, when the use amount of the alkali-soluble resin (A) falls within the above range, a resin composition having good pattern characteristics that can form a pattern without an undercut may be obtained. In addition, when the alkali-soluble resin (A) does not include the alkali-soluble resin (A-1), the pattern characteristics of the photosensitive resin composition are poor, and the photosensitive resin composition is formed with a pattern having an undercut.

Alkali-Soluble Resin (A-2)

The alkali-soluble resin (A) may further include an alkali-soluble resin (A-2).

The alkali-soluble resin (A-2) includes a structural unit represented by formula (I-3-1).

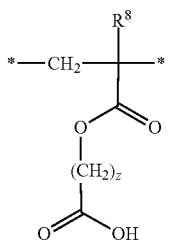

formula (I-3-1)

In formula (I-3-1), $R^8$ represents a hydrogen atom or a methyl group, preferably a methyl group;

z represents an integer of 1 to 10;

* represents a bonding position.

In addition, without affecting the efficacy of the invention, the alkali-soluble resin (A-2) may further include at least one selected from the group consisting of an acrylic-based structural unit, a styrene-based structural unit, and a maleimide-based structural unit. The acrylic-based structural unit, the styrene-based structural unit, and the maleimide-based structural unit that may be included in the alkali soluble resin (A-2) are the same as the acrylic-based structural unit, the styrene-based structural unit, and the maleimide-based structural unit that may be included in the alkali-soluble resin (A-1) and are not repeated herein.

In an embodiment, the alkali-soluble resin (A-2) may further include a structural unit derived from methacrylic acid, a structural unit derived from styrene, and a structural unit derived from N-phenylmaleimide.

In an embodiment, the alkali-soluble resin (A-2) includes a structural unit represented by formula (I-3-1), a structural unit represented by formula (1-1), a structural unit represented by formula (2-1), and a structural unit represented by formula (3-1).

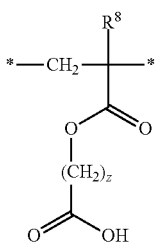

formula (I-3-1)

In formula (I-3-1), $R^8$ represents a methyl group;

z represents an integer of 1 to 10;

* represents a bonding position.

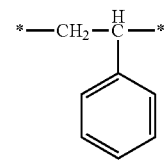

formula (1-1)

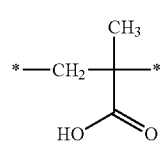

formula (2-1)

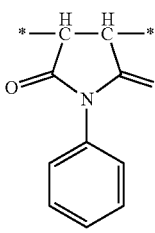

formula (3-1)

In an embodiment, the weight ratio of the alkali-soluble resin (A-1) and the alkali-soluble resin (A-2) is 1:1 to 1:3.

When the photosensitive resin composition further contains the alkali-soluble resin (A-2), the pattern characteristics of a spacer formed by the photosensitive resin compositions are generally good (no development residue or little development residue) and a pattern without an undercut may be formed. In addition, when the weight ratio of the alkali-soluble resin (A-1) and the alkali-soluble resin (A-2) is within the above range, a resin composition having good pattern characteristics (high edge linearity) may be obtained.

Alkali-Soluble Resins (A-3)

In an embodiment, the alkali-soluble resin (A) further includes an alkali-soluble resin (A-3), and the alkali-soluble resin (A-3) includes a structural unit represented by formula (I-4).

formula (I-4)

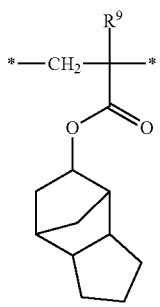

In formula (I-4), $R^9$ represents a hydrogen atom or a methyl group, $R^9$ preferably represents a methyl group; and * represents a bonding position.

In addition, without affecting the efficacy of the invention, the alkali-soluble resin (A-3) may further include at least one selected from the group consisting of an acrylic-based structural unit, a styrene-based structural unit, and a maleimide-based structural unit. The acrylic-based structural unit, the styrene-based structural unit, and the maleimide-based structural unit that may be included in the alkali soluble resin (A-3) are the same as the acrylic-based structural unit, the styrene-based structural unit, and the maleimide-based structural unit that may be included in the alkali-soluble resin (A-1) and are not repeated herein.

In an embodiment, the alkali-soluble resin (A-3) may further include a structural unit derived from methacrylic acid and a structural unit derived from benzyl methacrylate.

In an embodiment, the alkali-soluble resin (A-3) includes a structural unit represented by formula (I-4-1), the structural unit represented by formula (2-1), and a structural unit represented by formula (2-2).

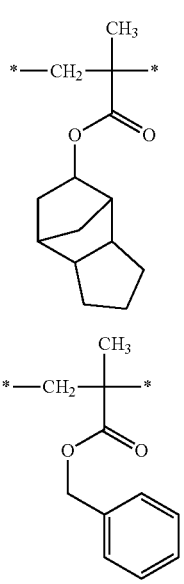

Ethylenically-Unsaturated Monomer (B)

The ethylenically-unsaturated monomer (B) in the photosensitive resin composition may undergo a polymerization reaction in a subsequent exposure step and baking step to form the photosensitive resin composition into a cured product.

The ethylenically-unsaturated monomer (B) includes a fluorine-containing ethylenically-unsaturated monomer (B-1). In addition, the ethylenically-unsaturated monomer (B) may also include other ethylenically-unsaturated monomers (B-2).

Fluorine-Containing Ethylenically-Unsaturated Monomer (B-1)

The fluorine-containing ethylenically-unsaturated monomer (B-1) is a compound represented by formula (II-1).

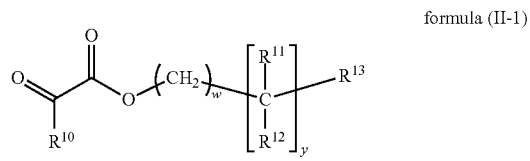

formula (II-1)

In formula (II-1), $R^{10}$ represents a hydrogen atom or a methyl group, and preferably represents a hydrogen atom;

$R^{11}$ and $R^{12}$ respectively represent a hydrogen atom or a fluorine atom, at least one of $R^{11}$ and $R^{12}$ is a fluorine atom, and preferably $R^{11}$ and $R^{12}$ both represent a fluorine atom;

$R^{13}$ represents a hydrogen atom, a fluorine atom, or an alkyl group, and preferably represents a hydrogen atom;

w represents an integer of 1 to 10, and preferably represents an integer of 1;

y represents an integer of 1 to 10, and preferably represents an integer of 2.

The fluorine-containing ethylenically-unsaturated monomer (B-1) includes 2,2,3,3-tetrafluoropropyl acrylate, 2,2,3,3-tetrafluoropropyl methacrylate, 2,2,2-trifluoroethyl acrylate, 2,2,2-trifluoroethyl methacrylate, 2,2,3,3,4,4,5,5-octafluoropentyl acrylate, 2,2,3,3,4,4,5,5-octafluoropentyl methacrylate, 3,3,4,4,5,5,6,6,7,7,8,8,8-fluorooctyl trifluoromethacrylate, or a combination of the above compounds, and preferably includes 2,2,3,3-tetrafluoropropyl acrylate.

When the photosensitive resin composition includes the fluorine-containing ethylenically-unsaturated monomer (B-1), a cured product formed by the photosensitive resin composition not only has good pattern characteristics and may form a pattern without an undercut, but also has good ink repellency.

Other Ethylenically-Unsaturated Monomers (B-2)

The compound of the ethylenically-unsaturated group may further include other ethylenically-unsaturated monomers (B-2).

The other ethylenically-unsaturated monomers (B-2) include a bifunctional monomer, a polyfunctional monomer, a compound having one or a plurality of thiol groups, a silane compound, or a combination thereof.

The bifunctional monomer includes 1,6-hexanediol diacrylate, diallyl terephthalate, diallyl phthalate, ethylene glycol dimethacrylate, 9,9-bis [4-(2-acryloyloxy ethyloxy)phenyl]fluorene, 9,9-bis [4-(2-hydroxy-3-propenyloxypropoxy) phenyl]fluorene (9H-fluorene-9,9-diyl)bis(4,1-phenylene)) bis(oxy))bis(ethane-2,1-diyl)diacrylate, fluorene-9 bisphenol diglycidyl ether diacrylate, or a combination of the above compounds. The bifunctional monomer preferably includes diallyl terephthalate, diallyl phthalate, 9,9-bis[4-(2-acryloyloxyethoxy)phenyl]fluorene, or a combination of the above compounds.

The multifunctional monomer includes pentaerythritol triacrylate, pentaerythritol tetraacrylate, ethoxylated pentaerythritol tetraacrylate, dipentaerythritol hexaacrylate, dipentaerythritol pentaacrylate, or a combination of the above compounds. The polyfunctional monomer preferably includes dipentaerythritol pentaacrylate, dipentaerythritol hexaacrylate, or a combination of the above compounds.

The compound having one or a plurality of thiol groups includes trimethylolpropane tris(3-mercaptobutyrate), trimethylolethane tris(3-mercaptobutyrate), 1,4-butanediol bis(3-mercaptobuty rate), tri[2-(3-mercaptobutyrate)ethyl]isocyanurate, pentaerythritol tetrakis(3-mercaptobutyrate), pentaerythritol tetrakis(3-mercaptopropionate), or a combination of the above compounds. The compound having one or a plurality of thiol groups preferably includes pentaerythritol tetrakis(3-mercaptobutyrate).

The silane compound includes 3-glycidyloxypropyltrimethoxysilane, 3-glycidoxypropyldimethylethoxysilane, 3-glycidoxypropylmethyldiethoxysilane, or a combination of the above compounds. The silane compound preferably includes 3-glycidoxypropyltrimethoxysilane.

Based on 100 parts by weight of the alkali-soluble resin (A), the ethylenically-unsaturated monomer (B) may be 15 parts by weight to 35 parts by weight, preferably 20 parts by weight to 30 parts by weight.

Photopolymerization Initiator (C)

The photopolymerization initiator (C) in the photosensitive resin composition may generate a free radical in a subsequent exposure step and cause a polymerization reaction to form the photosensitive resin composition into a cured product.

The photopolymerization initiator (C) includes an acylphosphine oxide compound (C-1). In addition, the photopolymerization initiator (C) may further include an oxime ester-based compound (C-2). In addition, the photopolymerization initiator (C) may also include other photopolymerization initiators (C-3).

Acylphosphine Oxide Compound (C-1)

The acylphosphine oxide compound (C-1) is an acylphosphine oxide compound represented by formula (III-1).

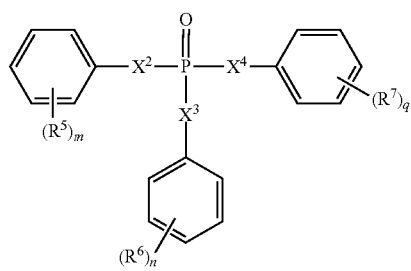

formula (III-1)

In formula (III-1), $X^2$, $X^3$, and $X^4$ respectively represent a single bond or a carbonyl group, and at least one of $X^2$, $X^3$, and $X^4$ is a carbonyl group;

$R^5$, $R^6$, and $R^7$ respectively represent an alkyl group;

m, n, and q respectively represent an integer of 0 to 5.

Specific examples of the acylphosphine oxide compound (C-1) include bis(2,4,6-trimethylbenzoyl)-phenylphosphine oxide (trade name: Irgacure 819, manufactured by BASF, the compound represented by the following formula (III-1-a)), diphenyl(2,4,6-trimethylbenzoyl)phosphine oxide (trade name: TPO, manufactured by BASF, the compound represented by the following formula (III-1-b)), or a combination of the above compounds. Specific examples of the acylphosphine oxide compound (C-1) preferably include bis(2,4,6-trimethylbenzyl)phenylphosphine oxide (trade name: Irgacure 819, manufactured by BASF).

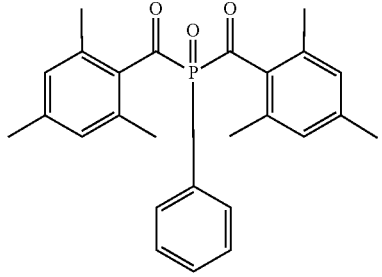

formula (III-1-a)

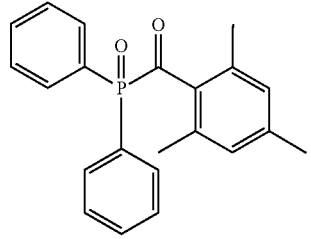

formula (III-1-b)

When the photopolymerization initiator (C) includes the acylphosphine oxide compound (C-1), the photosensitive resin composition may have good pattern characteristics, and the photosensitive resin composition may form a pattern without an undercut. In addition, when the photopolymerization initiator (C) does not include the acylphosphine oxide compound (C-1), the pattern characteristics of the photosensitive resin composition are poor, and the photosensitive resin composition forms a pattern having an undercut.

Oxime Ester-Based Compound (C-2)

The photopolymerization initiator (C) further includes an oxime ester-based compound (C-2).

The oxime ester-based compound (C-2) is a compound represented by formula (III-2).

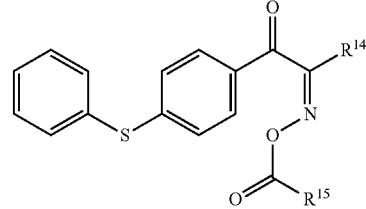

formula (III-2)

In formula (III-2), $R^{14}$ represents an alkyl group or a cycloalkyl group, and preferably represents a hexyl group or a cyclopentyl group;

$R^{15}$ represents an alkyl group or a phenyl group, and preferably represents a methyl group or a phenyl group.

Specific examples of oxime ester-based compound (C-2) include a compound represented by formula (III-2-1) (1,2-octanedione, 1-[4-(phenylthio)phenyl]-,2-(O-benzoyloxime)), (trade name: Irgacure OXE-01, manufactured by BASF), a compound represented by formula (III-2-2) (trade name: PBG-3057, manufactured by Changzhou Tronly New Electronic Materials Co., Ltd.), or a combination of the above compounds.

formula (III-2-1)

formula (III-2-2)

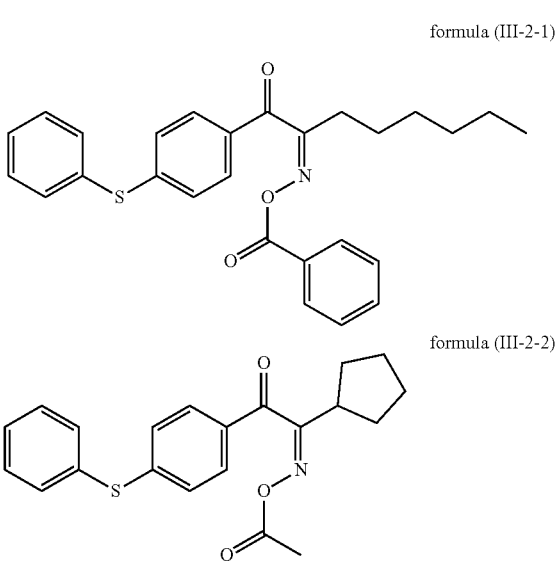

When the photopolymerization initiator (C) includes the acylphosphine oxide compound (C-1) and the oxime ester-based compound (C-2), the weight ratio of the acylphosphine oxide compound (C-1) and the oxime ester-based compound (C-2) is 10:1 to 4:1.

When the photopolymerization initiator (C) further includes the oxime ester-based compound (C-2), the photosensitive resin composition may be enhanced in reactivity, and pattern peeling does not readily occur during the development process, so that better pattern characteristics are obtained. At the same time, when the weight ratio of the acylphosphine oxide compound (C-1) and the oxime ester-based compound (C-2) falls within the above range, a curing reaction of a surface layer and a bottom layer of the photosensitive resin composition may be consistent, resulting in better pattern characteristics and taper angle.

Other Photopolymerization Initiators (C-3)

Without affecting the efficacy of the invention, the photopolymerization initiator (C) may also include other photopolymerization initiators (C-3). The other photopolymerization initiators (C-3) are not particularly limited, and are, for example, a triazine compound, an acetophenone compound, a diphenyl ketone compound, a diimidazole compound, a thioxanthone compound, a quinone compound, or a combination of the above compounds.

The triazine compound may include Chemcure-PAG-1 (trade name; manufactured by Chembridge International Corp.), Chemcure-PAG-2 (trade name; manufactured by Chembridge International Corp.), or other suitable triazine compounds. The triazine compound may be used alone or in combination.

The acetophenone compound may include Irgacure 907 and 369E (trade names; manufactured by BASF), Chemcure-96 (trade name; manufactured by Chembridge International Corp.) or other suitable acetophenone compounds. The acetophenone compound may be used alone or in combination.

The diphenyl ketone compound may include Chemcure-BP, Chemcure-64 (trade names; manufactured by Chembridge International Corp.) or other suitable diphenyl ketone compounds. The diphenyl ketone compound may be used alone or in combination.

The diimidazole compound may include Chemcure-BCIM, Chemcure-TCDM (trade names; manufactured by Chembridge International Corp.), or other suitable diimidazole compounds. The diimidazole compound may be used alone or in combination.

The thioxanthone may include Irgacure ITX (trade name; manufactured by BASF) or other suitable thioxanthone compounds. The thioxanthone compound may be used alone or in combination.

As the quinone compound, a suitable quinone compound may be selected. The quinone compound may be used alone or in combination.

Based on 100 parts by weight of the alkali-soluble resin (A), the photopolymerization initiator (C) may be 1 part by weight to 10 parts by weight, preferably 2 parts by weight to 5 parts by weight.

Solvent (D)

The solvent (D) in the photosensitive resin composition not only may be mixed with the alkali-soluble resin (A), the ethylenically-unsaturated monomer (B), the photopolymerization initiator (C), and the pigment (E), but the photosensitive resin composition may also have suitable viscosity so that the photosensitive resin composition may be coated on a substrate.

The solvent (D) is not particularly limited, as long as it may dissolve the alkali-soluble resin (A), the ethylenically-unsaturated monomer (B), the photopolymerization initiator (C), and the pigment (E), and a suitable solvent may be selected according to needs.

The solvent (D) preferably includes propylene glycol monomethyl ether acetate (PGMEA), ethyl 3-ethoxypropionate (EEP), ethyl lactate, butyl lactate, benzyl alcohol, 3-methoxybutyl acetate (MBA), 3-methoxy-3-methylbutanol, y-butyrolactone, propylene glycol monobutyl ether, or a combination of the above solvents. The solvent (D) more preferably includes propylene glycol monomethyl ether acetate.

The solvent (D) may be used alone or in combination.

Based on 100 parts by weight of the alkali-soluble resin (A), the solvent (D) may be 20 parts by weight to 60 parts by weight, preferably 30 parts by weight to 50 parts by weight.

Pigment (E)

The pigment (E) includes a white pigment (E-1). In addition, the pigment (E) may further include a black pigment (E-2). The selection of the pigment is not particularly limited, and only needs to ensure high reflectivity in order to be able to be implemented in one or more embodiments of the invention. However, in another or more embodiments of the invention, the high reflectivity may not be limited, and thus the pigment may be applied to an element such as a black spacer or other color spacers accordingly.

White Pigment (E-1)

The white pigment (E-1) is at least one selected from the group consisting of titanium oxide, silicon oxide, barium titanate, zirconium oxide, zinc oxide, aluminum oxide, magnesium oxide, antimony oxide, aluminum hydroxide, magnesium hydroxide, barium sulfate, calcium sulfate, magnesium carbonate, barium carbonate, calcium carbonate, strontium titanate, aluminum powder, kaolin, clay, talc, and montmorillonite.

When the pigment (E) includes the white pigment (E-1), the photosensitive resin composition may be used to prepare a white matrix, and may be applied to a color filter of a quantum dot light-emitting device. In this way, the white matrix may reflect light to improve the light utilization rate of the quantum dot light-emitting device and enhance the brightness of the quantum dot light-emitting device.

Black Pigment (E-2)

The pigment (E) may further include a black pigment (E-2). The black pigment (E-2) is at least one selected from the group consisting of carbon black, chromium oxide, iron oxide, and titanium black.

When the pigment (E) further includes the black pigment (E-2), the photosensitive resin composition may be used to prepare a gray matrix, and may be applied to a color filter of a quantum dot light-emitting device. Compared with the white matrix, the gray matrix may increase optical density (OD) to avoid light interaction (cross talk) between pattern layers.

Based on 100 parts by weight of the alkali-soluble resin (A), the pigment (E) may be 55 parts by weight to 95 parts by weight, preferably 60 parts by weight to 80 parts by weight.

Additive (F)

Under the premise of not affecting the efficacy of the invention, the photosensitive resin composition of the invention may optionally further include an additive (F). The additive (F) is not particularly limited, and specifically, the additive (F) may include a leveling agent. The leveling agent includes a siloxane-based surfactant, a silicone-based surfactant, a fluorine-based surfactant, or a combination thereof.

The siloxane-based surfactant may include a polysiloxane-based surfactant. For example, the siloxane-based surfactant may include BYK-307, BYK-323, BYK-348 (trade names; manufactured by BYK Chemical Co., Ltd.), KP323, KP324, KP340, KP341 (trade names; manufactured by Shin-Etsu Chemical Co., Ltd.) or other suitable siloxane-based surfactants. The siloxane-based surfactant may be used alone or in combination.

The silicone-based surfactant may include BYK-333 (trade name; manufactured by BYK Chemical Co., Ltd.) or other suitable silicone-based surfactants. The silicone-based surfactant may be used alone or in combination.

The fluorine-based surfactant may include Megaface F-477, F-554, F-556, F-563, F-575, RS-72-K (trade names; manufactured by DIC Co., Ltd.) or other suitable fluorine-based surfactants. The fluorine-based surfactant may be used alone or in combination.

When the resin composition further includes a leveling agent as the additive (F), the photosensitive resin composition may have good coating uniformity.

Based on 100 parts by weight of the alkali-soluble resin (A), the additive (F) may be no more than 5 parts by weight, and is preferably 1 part by weight to 5 parts by weight.

<Preparation Method of Photosensitive Resin Composition>

The method of preparing the photosensitive resin composition is not particularly limited. For example, the alkali-soluble resin (A), the ethylenically-unsaturated monomer (B), the photopolymerization initiator (C), and the solvent (D) are placed in a stirrer for stirring to be uniformly mixed into a solution state. If necessary, the additive (F) may also be added, and after uniform mixing, a photosensitive resin composition in liquid state may be obtained.

<Manufacturing Method of Spacer>

An exemplary embodiment of the invention provides a spacer formed using the photosensitive resin composition above.

The spacer may be formed by coating the photosensitive resin composition on a substrate to form a coating film and performing pre-bake, exposure, development, and post-bake on the coating film. For example, after the photosensitive resin composition is coated on the substrate to form the coating film, a pre-exposure baking (i.e., pre-baking) step is performed at a temperature of 100° C. for 60 seconds. Next, a photomask having a predetermined pattern is used for exposure, the spacing of the film surface and the photomask is controlled to 50 μm, and the pre-baked coating film is exposed with light of 100 mJ/cm$^2$ using a high-pressure mercury lamp. Then, the exposed coating film is developed for 50 seconds. Next, the developed coating film is rinsed using distilled water and nitrogen gas is blown to dry the coating film. Next, post-bake is performed at 220° C. for 45 minutes to form a spacer on the substrate.

The substrate may be a glass substrate, a plastic base material (such as a polyethersulfone (PES) board, a polycarbonate (PC) board, or a polyimide (PI) film) or other light-permeable substrates, and the type is not particularly limited.

The coating method is not particularly limited, but a spray coating method, a roll coating method, a spin coating method, or the like may be used, and in general, a spin coating method is widely used. In addition, a coating film is formed, and then, in some cases, the residual solvent may be partially removed under reduced pressure.

The developing solution is not particularly limited, and a suitable developing solution may be selected according to needs. For example, the developing solution may be an aqueous solution of potassium hydroxide (KOH), and the concentration thereof may be 0.038 wt %.

<Light-Emitting Device>

An exemplary embodiment of the invention provides a light-emitting device including the above spacer. Here, when the photosensitive resin composition includes a white pigment, the photosensitive resin composition may be used to form white spacers; and when the photosensitive resin composition includes both a black pigment and a white pigment, the photosensitive resin composition may be used to form gray spacers.

FIG. 1 is a diagram of a light-emitting device according to an embodiment of the invention. A light-emitting device 10 includes a substrate 120, a backlight module 200, and a light conversion layer 160, wherein the backlight module 200 and the substrate 120 are oppositely disposed, and the light conversion layer 160 is located between the substrate 120 and the backlight module 200. In the present embodiment, the light-emitting device 10 may further include a light filter layer 140, wherein the light filter layer 140 is located between the substrate 120 and the light conversion layer 160. The light-emitting device 10 may further include a gas barrier layer, a transparent optical adhesive layer, a polarizing plate, an alignment film, a liquid crystal (not shown), or other elements known to those having ordinary skill in the art, which are not repeated herein.

In the present embodiment, the substrate 120 is a light-permeable substrate. The material of the substrate 120 may be glass, organic polymer (for example, polyimide (PI), polyethersulfone (PES), or polycarbonate (PC)), or other suitable materials.

In the present embodiment, the light filter layer 140 includes a plurality of light filter patterns 142 and a plurality of black spacers 144. The plurality of black spacers 144 are respectively interposed between the plurality of light filter patterns 142, so that one of the light filter patterns 142 of the plurality of light filter patterns 142 is present between every two adjacent black spacers 144 in the plurality of black spacers 144. The plurality of light filter patterns 142 include a red light filter pattern 142R, a green light filter pattern 142G, and a blue light filter pattern 142B. In other words, the light filter patterns 142 may be red light filter patterns 142R, green light filter patterns 142G, or blue light filter patterns 142B. In addition, the red light filter pattern 142R, the green light filter pattern 142G, and the blue light filter pattern 142B do not contain a quantum dot.

In the present embodiment, the light conversion layer 160 includes a plurality of pattern layers 162 and a plurality of white spacers 164. The plurality of white spacers 164 are respectively interposed between the plurality of pattern layers 162 so that one of the plurality of pattern layers 162 is present between every two adjacent white spacers 164 in the plurality of white spacers 164. The plurality of pattern layers 162 include a red pattern layer 162R, a green pattern layer 162G, and a scatterer pattern layer 162S. In other words, the pattern layers 162 may be red pattern layers 162R, green pattern layers 162G, or scatterer pattern layers 162S. In addition, the red pattern layer 162R includes a red quantum dot. The green pattern layer 162G includes a green quantum dot. The scatterer pattern layer 162S does not contain a quantum dot. Here, the white spacers 164 are used as reflective layers, and the white spacers 164 may also be replaced with gray spacers.

In the present embodiment, the red pattern layer 162R is located under the red light filter pattern 142R; the green pattern layer 162G is located under the green light filter pattern 142G; and the scatterer pattern layer 162S is located under the blue light filter pattern 142B. Furthermore, the edge of the red pattern layer 162R of the light conversion layer 160 is substantially aligned with the edge of the red light filter pattern 142R of the light filter layer 140; the edge of the green pattern layer 162G of the light conversion layer 160 is substantially aligned with the edge of the green light filter pattern 142G of the light filter layer 140; and the edge of the scatterer pattern layer 162S of the light conversion layer 160 is substantially aligned with the edge of the blue light filter pattern 142B of the light filter layer 140.

In addition, the black spacers 144 in the light filter layer 140 are located on the white spacers 164 in the light conversion layer 160. Furthermore, the edge of the white spacers 164 in the light conversion layer 160 is substantially aligned with the edge of the black spacers 144 in the light filter layer 140.

The backlight module 200 irradiates the light conversion layer 160 with light. For example, the backlight module 200 is suitable for providing a light source, and the light emitted by the light source sequentially passes through the light conversion layer 160, the light filter layer 140, and the substrate 120 to provide a converted light source. In the present embodiment, the type of the light source used in the backlight module 200 may include an organic light-emitting diode (OLED), a micro LED, or other suitable light sources. In the present embodiment, the backlight module 200 is a light source emitting blue light. After the blue light emitted by the backlight module 200 is absorbed by the red quantum dot in the red pattern layer 162R and the green quantum dot in the green pattern layer 162G, converted light may be emitted from the red pattern layer 162R and the green pattern layer 162G, respectively, and pass through the red light filter pattern 142R and the green light filter pattern 142G of the light filter layer 140 respectively to emit red light and green light; and the blue light emitted by the backlight module 200 directly passes through the scatterer pattern layer 162S without a quantum dot to emit blue light, and then passes through the blue light filter pattern 142B of the light filter layer 140 to emit blue light. For example, when the light emitted by the light source through the light conversion layer 160 and the light filter layer 140 includes visible light (such as red light, green light, and blue light), the light-emitting device 10 may be applied to a display panel or other suitable devices. Therefore, the display panel of the light-emitting device 10 including the light conversion layer formed by the resin composition above may exhibit better brightness and color purity than a conventional light-emitting device. However, the invention is not limited thereto. In an embodiment, the light filter layer 140 (the red light filter pattern 142R) does not filter out near-infrared light and therefore may also be used for applications emitting near-infrared light.

Figure 2:
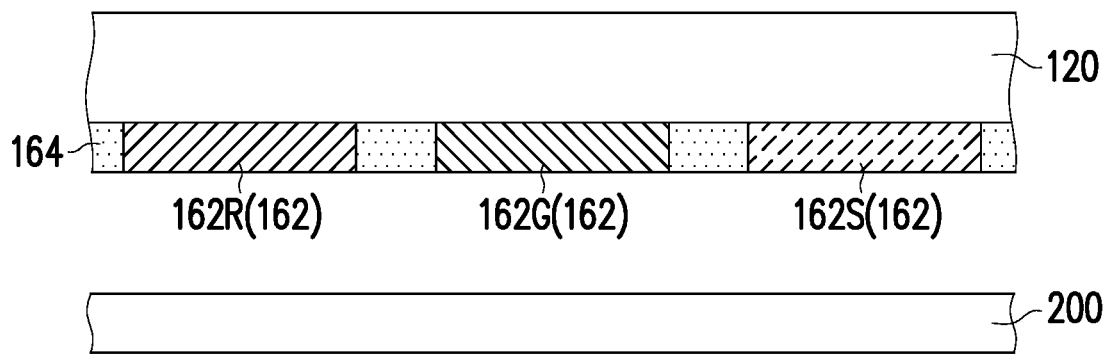
FIG. 2 is a diagram of a light-emitting device according to another embodiment of the invention.

FIG. 2 is a diagram of a light-emitting device according to another embodiment of the invention. It should be mentioned here that, the embodiment of FIG. 2 adopts the reference numerals of the embodiment of FIG. 1 and a portion of the contents thereof, wherein the same or similar reference numerals are used to represent the same or similar elements and descriptions of the same technical contents are omitted. The omitted portions are as described in the embodiments above and are not repeated in the embodiments below.

The main difference between the embodiment of FIG. 2 and the embodiment of FIG. 1 is that a light-emitting device 20 does not have the light filter layer 140.

Referring to FIG. 2, the light-emitting device 20 includes the substrate 120, the light conversion layer 160, and the backlight module 200, wherein the backlight module 200 and the substrate 120 are oppositely disposed, and the light conversion layer 160 is located between the substrate 120 and the backlight module 200. In the present embodiment, the light filter layer 140 without a quantum dot is absent between the light conversion layer 160 and the substrate 120.

In the present embodiment, the light emitted by the light source provided by the backlight module 200 sequentially passes through the light conversion layer 160 and the substrate 120 to provide a converted light source. After the blue light emitted by the backlight module 200 is absorbed by the red quantum dot in the red pattern layer 162R and the green quantum dot in the green pattern layer 162G, converted light may be emitted from the red pattern layer 162R and the green pattern layer 162G, respectively; and the blue light emitted by the backlight module 200 directly passes through the scatterer pattern layer 162S without a quantum dot to emit blue light. For example, when the light emitted by the light source through the light conversion layer 160 includes visible light (such as red light, green light, and blue light), the light-emitting device 20 may be applied to an electromagnetic radiation device or other suitable devices. Therefore, compared with a conventional light-emitting device and/or the electromagnetic radiation device above including the light-emitting device 10, the electromagnetic radiation device including the light-emitting device 20 may not only display better brightness and color purity, but may also omit the step of manufacturing the light filter layer to reduce the manufacturing cost of the light-emitting device. For example, when the light emitted by the light source through the light conversion layer 160 includes near-infrared light (for example, a wavelength of about 780 nm to 800 nm), the light-emitting device 20 may be applied to an electromagnetic radiation device or other suitable devices.

Hereinafter, the invention is described in detail with reference to examples. The following examples are provided to describe the invention, and the scope of the invention includes the scope of the following claims and their substitutes and modifications, and is not limited to the scope of the examples.

Experimental Examples of Resin Composition and Light Conversion Layer

Example 1 to Example 9 and Comparative example 1 to Comparative example 3 of the photosensitive resin composition and the spacer are described below:

Experimental Example 1 a. Photosensitive Resin Composition 32 parts by weight of the alkali-soluble resin (A-1) (manufactured by Showa Denko Co., Ltd.), 34 parts by weight of the alkali-soluble resin (A-2), 34 parts by weight of the alkali-soluble resin (A-3), 9.3 parts by weight of a mixture of dipentaerythritol pentaacrylate and dipentaerythritol hexaacrylate, 2.4 parts by weight of pentaerythritol tetrakis(3-mercaptobutyrate), 4.5 parts by weight of 9,9-bis[4-(2-propenyloxyethoxy)phenyl]fluorene, 6.9 parts by weight of a mixture of diallyl terephthalate and diallyl phthalate, 2.4 parts by weight of 3-glycidoxypropyltrimethoxysilane, 1.7 parts by weight of 2,2,3,3-tetrafluoropropyl acrylate, 2.4 parts by weight of Irgacure 819, and 60.8 parts by weight of titanium oxide dispersion (manufactured by Sanyo Color Works, Ltd.) were added to 47 parts by weight of propylene glycol monomethyl ether acetate (PGMEA) and uniformly stirred with a stirrer to obtain the photosensitive resin composition of Experimental example 1.

b. Spacer

The photosensitive resin composition prepared in Experimental Example 1 was coated on a substrate by a spin coating method (spin coater model: MS-A150, manufactured by Mikasa Corporation, with a rotation speed of about 200 rpm). Next, pre-baking was performed at a temperature of 100° C. for 60 seconds to form a thin film. Then, using a photomask having a straight-through pattern and a linewidth/spacing of 1 micron to 100 microns, the distance between the photomask and the thin film surface was controlled to about 50 microns, and the pre-baked coating film was exposed with light of 100 mJ/cm² using a high-pressure mercury lamp containing g, h, i, i⁺ rays (model UX-1000SM-ANC01, manufactured by Ushio, Inc.) to form a semi-finished product. Next, development was performed at a temperature of 23° C. using the aqueous solution of potassium hydroxide having a concentration of 0.038 wt % as a developing solution for 50 seconds. Next, the developed coating film was rinsed using distilled water and nitrogen gas was blown to dry the coating film. Then, post-baking was performed at 220° C. for 45 minutes to obtain a spacer having a pattern thickness of 8 microns. Each of the obtained spacers was evaluated by each of the following evaluation methods, and the results thereof are as shown in Table 2.

Experimental Example 2 to Experimental Example 9 and Comparative Example 1 to Comparative Example 3

The photosensitive resin compositions of Experimental example 2 to Experimental example 9 and Comparative example 1 to Comparative example 3 were prepared using the same steps as Experimental example 1, with the difference being: the type and the usage amount of the components of the photosensitive resin compositions were changed (as shown in Table 2 and Table 3), wherein the components/compounds corresponding to the labels of Table 2 and Table 3 are as shown in Table 1. The resulting photosensitive resin composition was formed into a spacer and evaluated by each of the following evaluation methods, and the results are as shown in Table 2 and Table 3. The blank spaces in Table 2 and Table 3 without values indicate "no addition (the component)".

TABLE 1

| Label | Component/compound |
|---|---|
| | Alkali-soluble resin (A) |
| A-1 | The alkali-soluble resin (A-1) (manufactured by Showa Denko Co., Ltd.) includes the structural unit represented by formula (I-1-1) and the structural unit represented by formula (I-2-1). 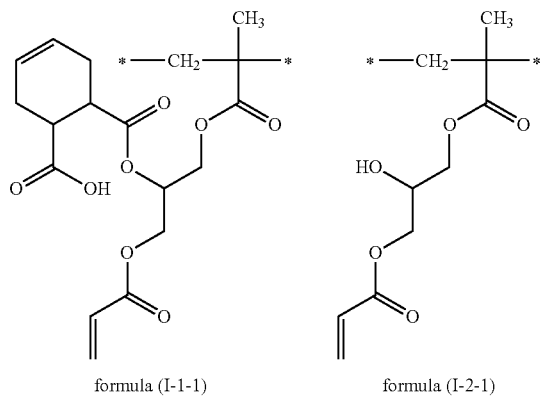 formula (I-1-1)   formula (I-2-1) |
| A-2 | The alkali-soluble resin (A-2) (manufactured by Miyuan Corporation) includes the structural unit represented by formula (I-3-1), the structural unit represented by formula (1-1), the structural unitrepresented by formula (2-1), and the structural unit represented by formula (3-1). |

TABLE 1-continued

| Label | Component/compound |
|---|---|

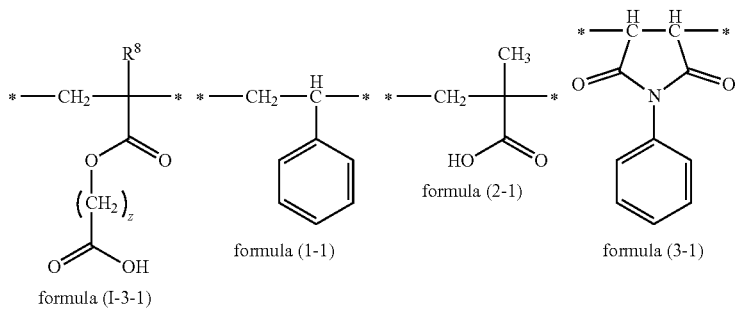

formula (I-3-1)    formula (1-1)    formula (3-1)

In formula (I-3-1), $R^8$ represents a methyl group; z represents an integer of 1 to 10; and * represents a bonding position.

A-3  The alkali-soluble resin (A-3) (manufactured by Miwon Corporation) includes the structural unit represented by formula (I-4-1), the structural unit represented by formula (2-1), and the structural unit represented by formula (2-2).

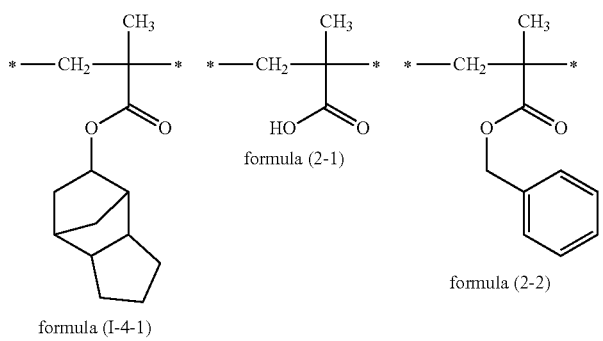

formula (I-4-1)    formula (2-1)    formula (2-2)

Ethylenically-unsaturated monomer (B)

B-1  A mixture of dipentaerythritol pentaacrylate and dipentaerythritol hexaacrylate (trade name: KAYARAD DPHA, manufactured by Nippon Kayaku Co., Ltd.)
B-2  Pentaerythritol tetrakis(3-mercaptobutyrate) (trade name: Karenz PE1 AG, manufactured by Showa Denko Co., Ltd.)
B-3  9,9-bis[4-(2-propenyloxyethoxy)phenyl]fluorene (trade name: FO-64, manufactured by Chembridge Industrial Co., Ltd.)

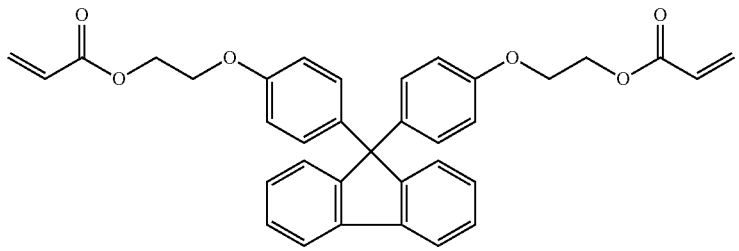 [SMILES: C=CC(=O)OCCOc1ccc(C2(c3ccc(OCCOC(=O)C=C)cc3)c3ccccc3-c3ccccc32)cc1]

B-4  A mixture of diallyl terephthalate and diallyl phthalate (manufactured by Chembridge Industrial Co., Ltd.)

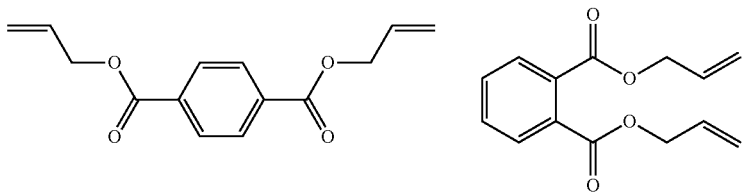 [SMILES: C=CCOC(=O)c1ccc(C(=O)OCC=C)cc1 ; C=CCOC(=O)c1ccccc1C(=O)OCC=C]

B-5  3-glycidoxypropyltrimethoxysilane (trade name: CB-660, manufactured by Chembridge Industrial Co., Ltd.)

TABLE 1-continued

| Label | Component/compound |
|---|---|

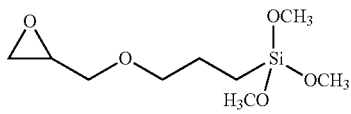

B-6  2,2,3,3-tetrafluoropropyl acrylate

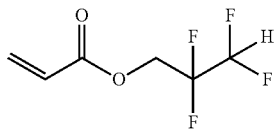

Photopolymerization initiator (C)

C-1  Acylphosphine oxide compound: bis(2,4,6-trimethylbenzyl)phenylphosphine oxide (trade name: Irgacure 819, manufactured by BASF)

C-2  Oxime ester-based compound: PBG-3057 (manufactured by Changzhou Tronly New Electronic Materials Co., Ltd.)

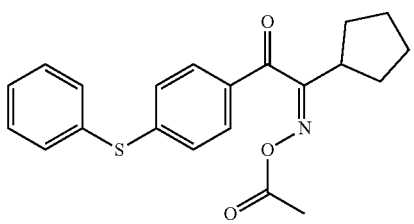

formula (III-2-2)

C-3  Oxime ester-based compound: 1,2-octanedione,1-[4-(phenylthio)phenyl-,2-(O-benzoyl oxime)] (trade name: Irgacure OXE-01, manufactured by BASF)

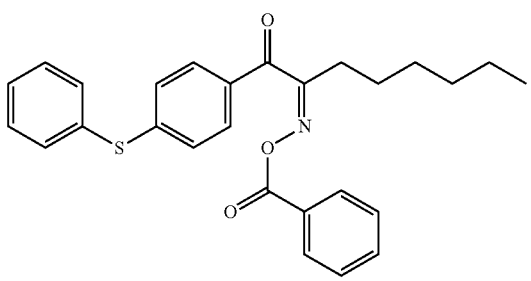

formula (III-2-1)

Solvent (D)

D-1  Propylene glycol monomethyl ether acetate

Pigment (E)

E-1  Titanium oxide dispersion (manufactured by Sanyo Color Works, Ltd.)
E-2  Barium titanate dispersion (manufactured by Tokushiki Co., Ltd.)
E-3  Zinc oxide dispersion (manufactured by Iridos, Co. Ltd.)
E-4  Carbon black dispersion (manufactured by Tokushiki Co., Ltd.)

TABLE 2

| Component (unit: parts by weight) | | Experimental example 1 | Experimental example 2 | Experimental example 3 | Experimental example 4 | Experimental example 5 | Experimental example 6 | Experimental example 7 | Experimental example 8 | Experimental example 9 |
|---|---|---|---|---|---|---|---|---|---|---|
| Alkali-soluble resin (A) | A-1 | 32 | 32 | 45 | 32 | 32 | 32 | 32 | 32 | 32 |
|  | A-2 | 34 | 34 | 55 | 34 | 34 | 34 | 34 | 34 | 34 |
|  | A-3 | 34 | 34 |  | 34 | 34 | 34 | 34 | 34 | 34 |
| Ethylenically-unsaturated | B-1 | 9.3 | 9.3 | 9.1 | 9.2 | 10.4 | 9.0 | 9.3 | 10.9 | 9.3 |
|  | B-2 | 2.4 | 2.4 | 2.3 | 2.4 | 2.6 | 2.2 | 2.4 | 2.4 | 2.4 |

TABLE 2-continued

| Component (unit: parts by weight) | | Experimental example 1 | Experimental example 2 | Experimental example 3 | Experimental example 4 | Experimental example 5 | Experimental example 6 | Experimental example 7 | Experimental example 8 | Experimental example 9 |
|---|---|---|---|---|---|---|---|---|---|---|
| monomer (B) | B-3 | 4.5 | 4.5 | 4.4 | 4.5 | 5.2 | 4.5 | 4.5 | 4.5 | 6.2 |
| | B-4 | 6.9 | 6.9 | 6.7 | 6.9 | 7.8 | 6.7 | 6.9 | 6.9 | 6.9 |
| | B-5 | 2.4 | 2.4 | 2.3 | 2.4 | 2.6 | 2.5 | 2.4 | 2.4 | 2.4 |
| | B-6 | 1.7 | 1.7 | 1.6 | 0.7 | 1.8 | 1.7 | 1.7 | | |
| Photopolymerization initiator (C) | C-1 | 2.4 | 1.9 | 1.9 | 1.9 | 2.1 | 2.0 | 1.9 | 1.9 | 1.9 |
| | C-2 | | 0.5 | 0.5 | 0.5 | 0.5 | 0.5 | 0.5 | 0.5 | 0.5 |
| | C-3 | | | | | | | | | |
| Solvent (D) | D-1 | 47 | 47 | 44 | 47 | 34 | 43 | 47 | 47 | 47 |
| Pigment (E) | E-1 | 60.8 | 60.8 | 59.5 | 60.7 | | | 60.8 | 60.8 | 60.8 |
| | E-2 | | | | | 93.8 | | | | |
| | E-3 | | | | | | 77.3 | | | |
| | E-4 | | | | | | | 0.24 | | |
| A-1:A-2 (weight ratio) | | 1:1.07 | 1:1.07 | 1:1.24 | 1:1.06 | 1:1.06 | 1:1.06 | 1:1.07 | 1:1.07 | 1:1.07 |
| Acylphosphine oxide compound (C-1); Oxime ester-based compound ((C-2) + (C-3)) (weight ratio) | | 1:0 | 4:1 | 4:1 | 4:1 | 4:1 | 4:1 | 4:1 | 4:1 | 4:1 |
| Evaluation results | Pattern characteristics | ○ | ◎ | ○ | ◎ | ◎ | ◎ | ◎ | ◎ | ◎ |
| | Taper angle | ○ | ○ | ○ | ○ | ○ | ○ | ○ | ○ | ○ |
| | Ink repellency | ◎ | ◎ | ◎ | ○ | ◎ | ◎ | ◎ | X | X |

TABLE 3

| Component (unit: parts by weight) | | Comparative example 1 | Comparative example 2 | Comparative example 3 |
|---|---|---|---|---|
| Alkali-soluble resin (A) | A-1 | 29 | | 32 |
| | A-2 | | 33 | 34 |
| | A-3 | 71 | 67 | 34 |
| Ethylenically-unsaturated monomer (B) | B-1 | 9.7 | 9.0 | 9.3 |
| | B-2 | 2.5 | 2.3 | 2.4 |
| | B-3 | 4.7 | 4.4 | 4.5 |
| | B-4 | 7.2 | 6.7 | 6.9 |
| | B-5 | 2.5 | 2.3 | 2.4 |
| | B-6 | 1.7 | 1.6 | 1.7 |
| Photopolymerization initiator (C) | C-1 | 2.0 | 1.9 | |
| | C-2 | 0.5 | 0.5 | 0.5 |
| | C-3 | | | 1.9 |
| Solvent (D) | D-1 | 49 | 46 | 47 |
| Pigment (E) | E-1 | 63.5 | 59.4 | 60.8 |
| | E-2 | | | |
| | E-3 | | | |
| | E-4 | | | |
| A-1:A-2 (weight ratio) | | 1:0 | 1:1 | 1:1.07 |
| Acylphosphine oxide compound (C-1); Oxime ester-based compound ((C-2) + (C-3)) (weight ratio) | | 4:1 | 4:1 | 0:1 |
| Evaluation results | Pattern characteristics | X | ◎ | X |
| | Taper angle | ○ | X | X |
| | Ink repellency | ◎ | ◎ | ◎ |

<Evaluation Methods> a. Pattern Characteristics

Using an optical microscope (model MX61, manufactured by Olympus Co., Ltd.), pattern characteristics were evaluated by observing whether the pattern characteristics of an opening portion (width of 50 microns) between two adjacent spacers remained neat and whether there was photosensitive resin composition residue on the edge of the pattern on the substrate.

The evaluation criteria for the pattern characteristics are as follows:

◎: edge linearity of linear pattern was high, and no photosensitive resin composition residue at the edge of the pattern on the substrate;

○: edge of linear pattern was not straight, and there was some photosensitive resin composition residue at the edge of the pattern on the substrate;

X: edge of linear pattern was not straight, and there was a large amount of photosensitive resin composition residue at the edge of the pattern on the substrate, or the pattern was peeled off from the substrate.

b. Undercut Pattern

The prepared spacers were observed with an electron microscope (model SU8000, manufactured by Hitachi) at a magnification of 10000 times to observe the taper angle of the spacers on the substrate to evaluate whether there was an undercut pattern.

Figure 3A:
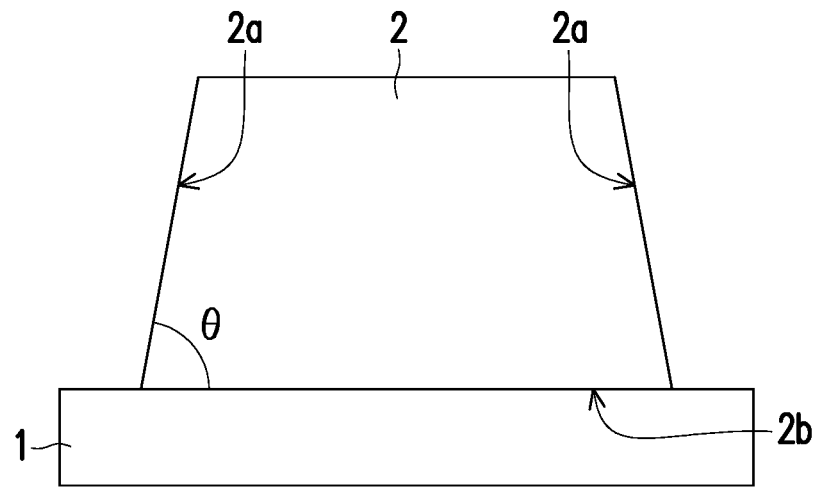
FIG. 3(a) and FIG. 3(b) are diagrams of the structure of a pattern.
Figure 3B:
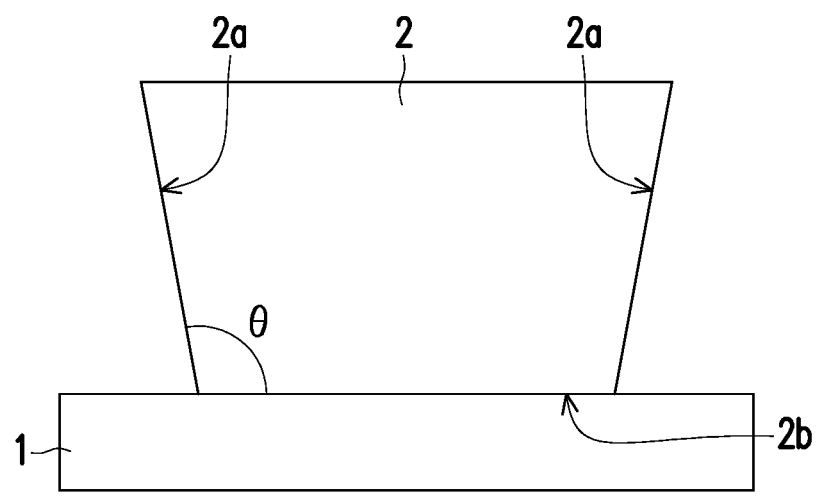

Specifically, FIG. 3(a) and FIG. 3(b) are diagrams of the structure of a pattern. As shown in FIG. 3(a) and FIG. 3(b), a spacer 2 is located on a substrate 1. The spacer 2 has two side surfaces 2a and a bottom surface 2b, wherein the bottom surface 2b is connected to the substrate 1, and the two side surfaces 2a are respectively adjacent to the bottom surface 2b. The angle between any of the two side surfaces 2a and the bottom surface 2b is defined as a taper angle θ.

The evaluation criteria for the undercut pattern are as follows:

○: as shown in FIG. 3(a), taper angle θ≤90°, no undercut pattern;

X: as shown in FIG. 3(b), taper angle θ>90°, with undercut pattern.

c. Ink Repellency (Hydrophobicity)

Propylene glycol monomethyl ether acetate (PGMEA, as a solvent) was added dropwise on the surface of the spacer using a micro syringe, and using a contact angle measurement device (model: DM500, manufactured by Kyowa Interface Science Co., Ltd.), a contact angle ψ between a tangent of the solvent at a liquid-solid-gas interface and the surface of the spacer was measured when the solvent was on the spacer.

The evaluation criteria of ink repellency (hydrophobicity) are as follows:

◎: 45° ≤ contact angle ψ;

○: 40° ≤ contact angle ψ < 45°;

X: contact angle ψ < 40°.

<Evaluation Results>

It may be seen from Table 2 and Table 3 that the pattern characteristics of the spacers formed by the photosensitive resin compositions (Examples 1 to 9) including both the alkali-soluble resin (A-1) and the acylphosphine oxide compound as the photopolymerization initiator (C) are generally good (no development residue or little development residue), and a pattern without an undercut may be formed. In contrast, the spacers formed by the photosensitive resin compositions (Comparative examples 2 and 3) that do not include both the alkali-soluble resin (A-1) and the acylphosphine oxide compound as the photopolymerization initiator (C) have an undercut pattern, and therefore the features of good pattern characteristics (no development residue or little development residue) and forming a pattern without an undercut may not both be obtained.

In addition, when the photosensitive resin composition further contains the alkali-soluble resin (A-2) (Examples 1 to 9), the pattern characteristics of the spacers formed by the photosensitive resin compositions (Examples 1 to 9) are generally good (no development residue or little development residue) and a pattern without an undercut may be formed. On the other hand, when the photosensitive resin composition does not contain the alkali-soluble resin (A-2) (Comparative example 1), the pattern characteristics of the resulting spacers are poor.

Furthermore, when the photosensitive resin composition includes a fluorine-containing ethylenically-unsaturated monomer (Experimental examples 1 to 7), the cured product formed by the photosensitive resin composition also has good ink repellency.

Based on the above, the photosensitive resin composition of the invention includes an alkali-soluble resin having a specific structural unit, and an acylphosphine oxide compound is used as a photopolymerization initiator to provide a photosensitive resin composition having good pattern characteristics (no development reside or little development residue) that may form a pattern without an undercut, thereby alleviating the phenomena of excessive development residue and undercut of a taper angle.

What is claimed is:

1. A photosensitive resin composition for a development process, comprising:
    an alkali-soluble resin (A);
    an ethylenically-unsaturated monomer (B);
    a photopolymerization initiator (C);
    a solvent (D); and
    a pigment (E),
    the alkali-soluble resin (A) comprises an alkali-soluble resin (A-1) and an alkali-soluble resin (A-2), wherein the alkali-soluble resin (A-1) comprises a structural unit represented by formula (I-1) and a structural unit represented by formula (I-2), and the alkali-soluble resin (A-2) comprises a structural unit represented by formula (I-3), formula (I-1)

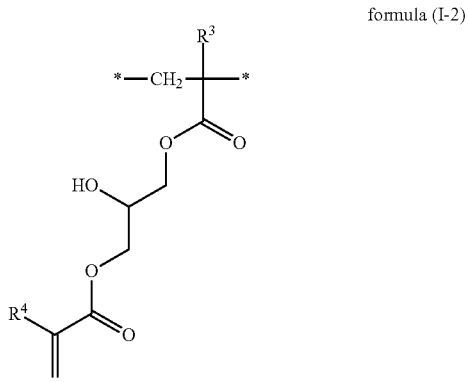

in formula (I-1), $R^1$ and $R^2$ espectively represent a hydrogen atom or a methyl group, $X^1$ represents ethylene, propylene, butylene, 1,2-phenylene, 1,2-cyclohexylene, 1,2-cyclohex-1-enylene, 4,5-cyclohex-1-enylene, or norbornenylene, and * represents a bonding position;

formula (I-2)

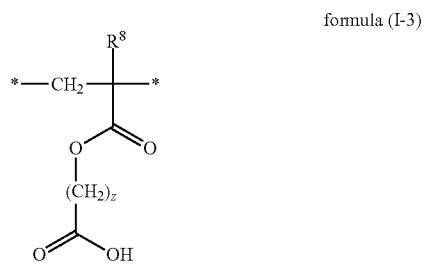

in formula (I-2), $R^3$ and $R^4$ espectively represent a hydrogen atom or a methyl group, and * represents a bonding position, formula (I-3)

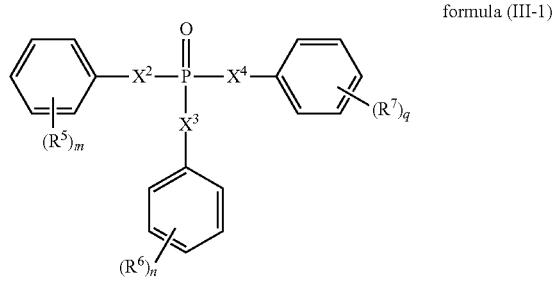

in formula (I-3), $R^8$ represents a hydrogen atom or a methyl group, z represents an integer of I to 10, and * represents a bonding position, the photopolymerization initiator (C) comprises an acylphosphine oxide compound represented by formula (III-1), formula (III-1)

in formula (III-1), $X^2$, $X^3$, and $X^4$ respectively represent a single bond or a carbonyl group, at least one of $X^2$, $X^3$, and $X^4$ is a carbonyl group, $R^5$, $R^6$, and $R^7$ respectively represent an alkyl group, and m, n, and q respectively represent an integer of 0 to 5.

2. The photosensitive resin composition of claim 1, wherein in the alkali-soluble resin (A-1), based on a total of 100 mol % of the structural unit represented by formula (I-1) and the structural unit represented by formula (I-2), the structural unit represented by formula (I-1) is 30 mol % to 60 mol %.

3. The photosensitive resin composition of claim 1, wherein a weight-average molecular weight of the alkali-soluble resin (A-1) is 3,000 to 20,000.

4. The photosensitive resin composition of claim 1, wherein an acid value of the alkali-soluble resin (A-1) is 30 mgKOH/g to 100 mgKOH/g.

5. The photosensitive resin composition of claim 1, wherein a weight ratio of the alkali-soluble resin (A-1) and the alkali-soluble resin (A-2) is 1:1 to 1:3.

6. The photosensitive resin composition of claim 1, wherein the alkali-soluble resin (A) further comprises an alkali-soluble resin (A-3), and the alkali-soluble resin (A-3) comprises a structural unit represented by formula (I-4),

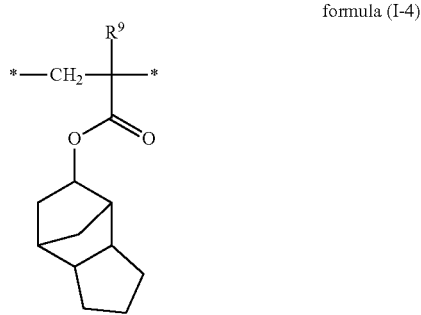

formula (I-4)

in formula (I-4), $R^9$ represents a hydrogen atom or a methyl group, and * represents a bonding position.

7. The photosensitive resin composition of claim 1, wherein the ethylenically-unsaturated monomer (B) comprises a fluorine-containing ethylenically-unsaturated monomer (B-1) represented by formula (II-1),

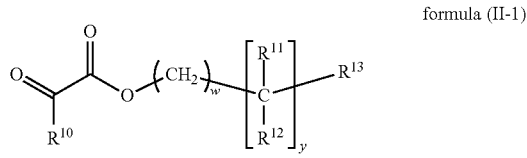

formula (II-1)

in formula (II-1), $R^{10}$ represents a hydrogen atom or a methyl group, R" and R'2 respectively represent a hydrogen atom or a fluorine atom, at least one of R" and R'2 is a fluorine atom, $R1^3$ represents a hydrogen atom, a fluorine atom, or an alkyl group, w represents an integer of 1 to 10, and y represents an integer of 1 to 10.

8. The photosensitive resin composition of claim 1, wherein the photopolymerization initiator (C) further comprises an oxime ester-based compound.

9. The photosensitive resin composition of claim 8, wherein in the photopolymerization initiator (C), a weight ratio of the acylphosphine oxide compound and the oxime ester-based compound is 10:1 to 4:1.

10. The photosensitive resin composition of claim 8, wherein the oxime ester-based compound is a compound represented by formula (III-2),

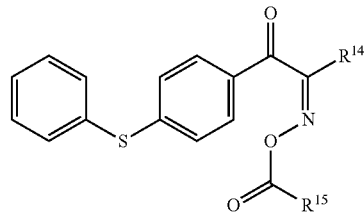

formula (III-2)

in formula (III-2), $R^{14}$ represents an alkyl group or a cycloalkyl group, and $R^{15}$ represents an alkyl group or a phenyl group.

11. The photosensitive resin composition of claim 1, wherein the pigment (E) comprises a white pigment (E-1), and the white pigment (E-1) is at least one selected from the group consisting of titanium oxide, silicon oxide, barium titanate, zirconium oxide, zinc oxide, aluminum oxide, magnesium oxide, antimony oxide, aluminum hydroxide, magnesium hydroxide, barium sulfate, calcium sulfate, magnesium carbonate, barium carbonate, calcium carbonate, strontium titanate, aluminum powder, kaolin, clay, talc, and montmorillonite.

12. The photosensitive resin composition of claim 11, wherein the pigment (E) further comprises a black pigment (E-2), and the black pigment (E-2) is at least one selected from the group consisting of carbon black, chromium oxide, iron oxide, and titanium black.

13. The photosensitive resin composition of claim 1, wherein based on 100 parts by weight of the alkali-soluble resin (A), the ethylenically-unsaturated monomer (B) is 15 parts by weight to 35 parts by weight, the photopolymerization initiator (C) is 1 part by weight to 10 parts by weight, the solvent (D) is 20 parts by weight to 60 parts by weight, and the pigment (E) is 55 parts by weight to 95 parts by weight.

14. A spacer formed by the photosensitive resin composition of claim 1.

15. A light-emitting device comprising the spacer of claim 14.

16. A light conversion layer, comprising:
a plurality of pattern layers; and
a plurality of white spacers formed by the photosensitive resin composition of claim 1;
wherein the plurality of white spacers are respectively interposed between the plurality of pattern layers, so that one of the plurality of pattern layers is present between every two adjacent white spacers in the plurality of white spacers.

17. The light conversion layer of claim 16, wherein the plurality of pattern layers are red pattern layers, green pattern layers, or scatterer pattern layers.

18. A light-emitting device, comprising:
a substrate;
a backlight module disposed opposite to the substrate; and
a light conversion layer located between the substrate and the backlight module,
wherein the light conversion layer is the light conversion layer of claim 16.

19. The light-emitting device of claim 18, further comprising a light filter layer located between the substrate and the light conversion layer.

* * * * *